United States Patent [19]

Nasu et al.

[11] Patent Number: 5,047,279

[45] Date of Patent: Sep. 10, 1991

[54] MULTILAYER PRINTED CIRCUIT BOARD

[75] Inventors: Yoshihiro Nasu, Hikone; Kazuyuki Mitsuhashi, Shiga, both of Japan

[73] Assignee: Shin-Kobe Electric Machinery Company, Ltd., Tokyo, Japan

[21] Appl. No.: 433,132

[22] Filed: Nov. 8, 1989

[30] Foreign Application Priority Data

Jan. 26, 1989 [JP] Japan .................................. 1-17261

[51] Int. Cl.⁵ .............................................. B32B 9/00
[52] U.S. Cl. .................................... 428/156; 428/209; 428/901; 361/397
[58] Field of Search ................. 428/901, 209; 361/397

[56] References Cited

U.S. PATENT DOCUMENTS 4,614,559  9/1986  Shirasawa et al. .................... 428/901
4,886,699  12/1989 Carroll et al. ......................... 428/228

FOREIGN PATENT DOCUMENTS 3038298  2/1988  Japan ................................... 428/901

OTHER PUBLICATIONS

Technical Digest No. 4, W. J. Gyurk, "Break Apart Laminated Substrates", Oct. 1966, p. 15.

*Primary Examiner*—Patrick J. Ryan
*Assistant Examiner*—Elizabeth Evans
*Attorney, Agent, or Firm*—Pearne, Gordon, McCoy & Granger

[57] ABSTRACT

A multilayer printed circuit board comprising a laminate of at least one glass fiber nonwoven cloth layer impregnated with thermosetting resin and glass fiber woven cloth layers impregnated with thermosetting resin, the laminate having a pair of V-cut grooves formed therein so that only the glass fiber nonwoven cloth layer remains uncut whereby the multilayer printed circuit board can be divided at the uncut glass fiber nonwoven cloth layer along the V-cut grooves into a plurality of printed circuit board portions which can be mounted having a practical size.

6 Claims, 4 Drawing Sheets

MULTILAYER PRINTED CIRCUIT BOARD

BACKGROUND OF THE INVENTION

A multilayer printed circuit board comprises an insulated board of insulated multilayers and electrically conducting layers provided on outer faces of the outer insulated layers and on both faces of the inner insulated layers. Such a multilayer printed circuit board serves to save spaces for printed circuits because the printed circuits are provided on both faces of the inner insulated layer or layers as well as on the outer faces of the outer insulated layers.

Of late, such multilayer printed circuit boards used when circuits are to be formed and various devices are to be mounted on the boards are of a size which is larger than a practical size in which the multilayer printed circuit boards are provided in the electronic instruments. Thus, the multilayer printed circuit boards have to be divided by any conventional dividing device, such as a puncher or a router, into a plurality of board portions or pieces having such a practical size in a finishing step.

In one prior art reference, the insulated board is formed of glass fiber woven cloth layers impregnated with thermosetting resin such as epoxy resin. However, a die of the puncher tends to be easily damaged because of hard glass fiber woven cloth layers. This prevents the multilayer printed circuit board from being inexpensively provided by mass-production. The multilayer printed circuit board is impossible to be punched as the thickness of the board becomes larger. It impractically takes much time for the multilayer printed circuit board to be divided by the router.

In another prior art reference, the insulated board is formed of glass fiber nonwoven cloth layers impregnated with thermosetting resin such as epoxy resin, as disclosed by Japanese Patent Application Laying-Open No. 117,883/1986. Such an insulated board can be easily divided because glass fiber nonwoven cloth layers are so soft as to never damage the die of the puncher. However, since the multilayer printed circuit board comprises only glass fiber nonwoven cloth layers impregnated with thermosetting resin, it undesirably has lower physical strength.

It will be proposed that the multilayer printed circuit board of working size formed of glass fiber woven cloth layers impregnated with thermosetting resin has cutting grooves which are to be used for breaking the board along the grooves whereby it can be divided into the board portions or pieces of practical or mounting size. However, it will take much time for the board to be broken because of hard glass fiber woven cloth layers. In addition thereto, the end faces formed by breaking the board tend to inconveniently have fins or thorns of glass fiber appearing thereon.

SUMMARY OF THE INVENTION

Accordingly, it is a principal object of the invention to provide a multilayer printed circuit board of working size adapted to be easily divided into a plurality of board portions or pieces of practical or mounting size.

It is another object of the invention to provide a multilayer printed circuit board adapted to have high physical strength although it can be easily divided.

It is a further object of the invention to provide a multilayer printed circuit board adapted to have no thorns of glass fiber appearing on end faces when it is broken.

In accordance with the present invention, there is provided a multilayer printed circuit board comprising;

a laminate of at least one insulated layer of glass fiber nonwoven cloth impregnated with thermosetting resin and insulated layers of glass fiber woven cloth impregnated with thermosetting resin;

said laminate having cutting grooves formed therein so that only glass fiber nonwoven cloth layer remains uncut whereby the multilayer printed circuit board can be divided at said uncut glass fiber nonwoven cloth layer along said cutting grooves into a plurality of printed circuit board portions which can be mounted having a practical size;

and the thickness of said uncut glass fiber nonwoven cloth layer being so set as to be equal to at least one-fourth of the entire thickness of the multilayer printed circuit board.

BRIEF DESCRIPTION OF THE DRAWINGS

The above and other objects and features of the invention will be apparent from the description of the embodiments of the invention with reference to the accompanying drawings in which.

DESCRIPTION OF THE PREFERRED EMBODIMENTS

Figure 1:
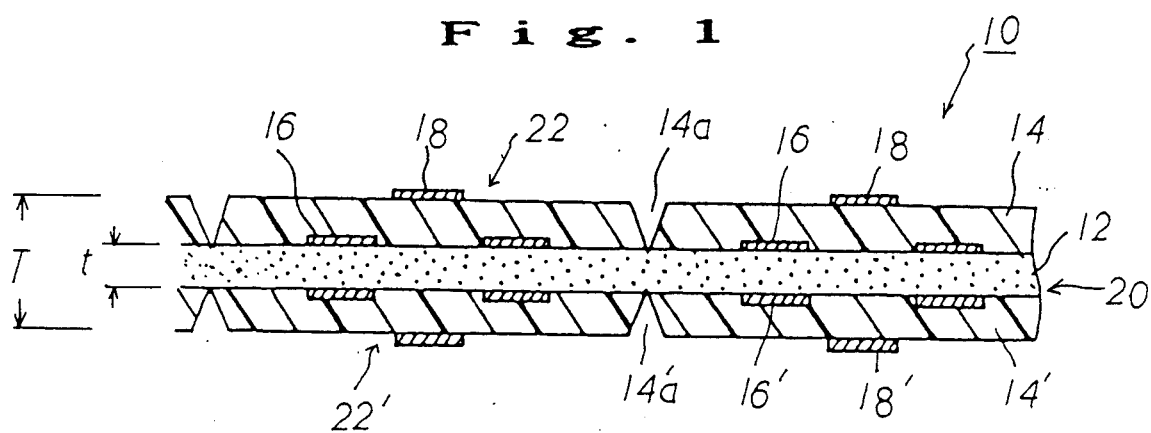
FIG. 1 is a cross sectional view of a multilayer printed circuit board constructed in accordance with one embodiment of the invention.

Referring now to FIG. 1, there is illustrated a multilayer printed circuit board 10 constructed in accordance with one embodiment of the invention. The multilayer printed circuit board 10 comprises a laminate of three insulated layers 12, 14 and 14' laminated on each other and electrically conducting circuit layers 16, 16' 18 and 18' of copper formed on the insulated layers 12, 14 and 14'. In the illustrated embodiment, the electrically conducting circuit inner layers 16 and 16' are formed between the inner insulated layer 12 and the outer insulated layers 14 and 14' so as to form inner circuit board portions 20, while the electrically conducting circuit outer layers 18 and 18' are formed on the outer faces of the outer insulated layers 14 and 14', respectively, so as to form outer circuit board portions 22 and 22'. The inner insulated layer 12 is formed of only glass fiber nonwoven cloth impregnated with thermosetting resin, while the outer insulated layers 14 and 14' are formed of glass fiber woven cloth impregnated with thermosetting resin. Cutting grooves 14a and 14'a are formed in the outer insulated layers 14 and 14' so that the inner insulated layer 12 remains uncut. In the illustrated embodiment, the cutting grooves 14a and 14'a are in the form of V-shape, but they may be in another form. The thermosetting resin with which the glass fiber woven cloth and glass fiber nonwoven cloth are impregnated may be epoxy resin, phenol resin and the like.

Figure 3:
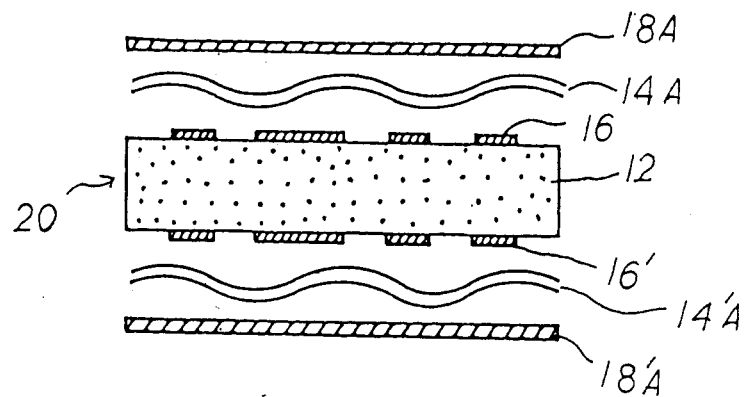
FIG. 3 illustrates a process of the multilayer printed circuit board of FIG. 1 being produced.

The multilayer printed circuit board 10 may be produced by a process illustrated in FIG. 3. After the inner circuit board portion 20 is previously prepared by providing the inner circuit layers 16 and 16' on the outer faces of the inner insulated layer 12, prepregs 14A and 14'A of glass fiber woven cloth impregnated with thermosetting resin are disposed on both faces of the inner circuit board portion 20 and then metal foils 18A and 18'A are disposed on the outer faces of the prepregs 14A and 14'A. The prepregs 14A and 14'A and the metal foils 18A and 18'A are thermally moulded under pressure so as to be integrally formed. Thereafter, the metal foils 18A and 18'A are etched to form the electrically conducting circuit outer layers 18 and 18'.

Figure 4:
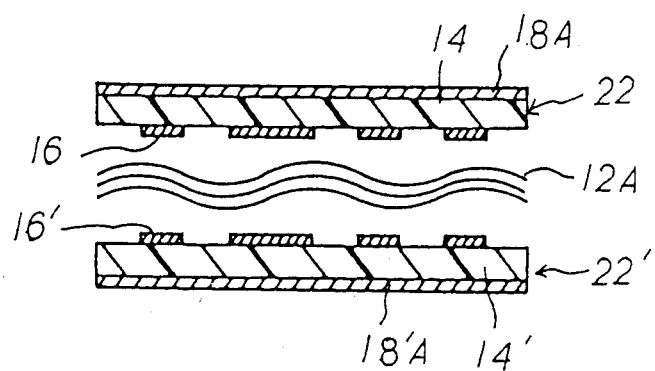
FIG. 4 illustrates an alternative process of the multilayer printed circuit board of FIG. 1 being produced.

Alternatively, the multilayer printed circuit board 10 may be produced by a process illustrated in FIG. 4. Two insulated layers 14 and 14' of glass fiber woven cloth impregnated with thermosetting resin having metal foils 16A, 16'A, 18A and 18'A (numerals 16A and 16'A not shown) covered on both faces thereof are prepared and etched on the metal foils 16A and 16'A to form one-face circuit board portions 22A and 22'A (not shown) having the electrically conducting circuit inner layers 16 and 16' provided on one-face thereof. These one face circuit board portions 22A and 22'A (reference numerals not shown) are placed on both faces of a prepreg 12A of glass fiber nonwoven cloth impregnated with thermosetting resin and they are thermally moulded under pressure to be integrally provided. Finally, the metal foils 18A and 18'A are etched to form the electrically conducting circuit outer layers 18 and 18'.

Figure 5:
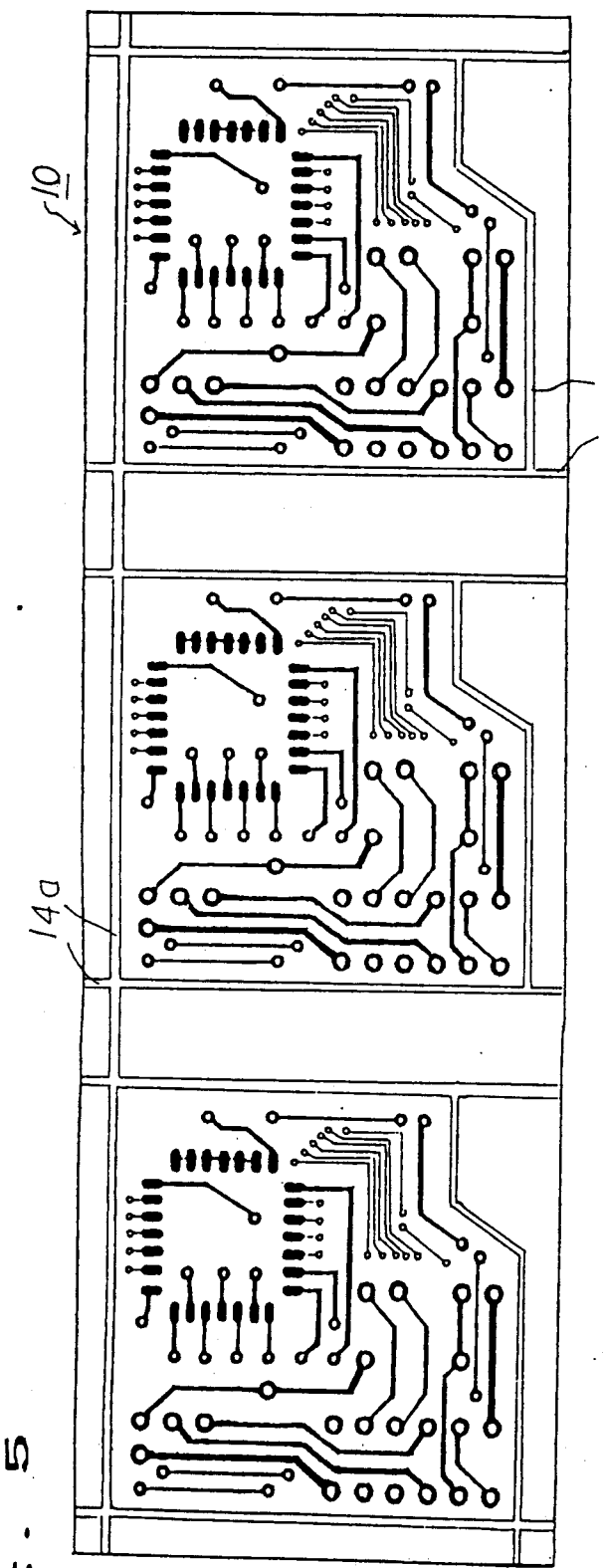
FIG. 5 illustrates in plan a portion of the practical multilayer printed circuit board constructed in accordance with the invention.
Figure 6:
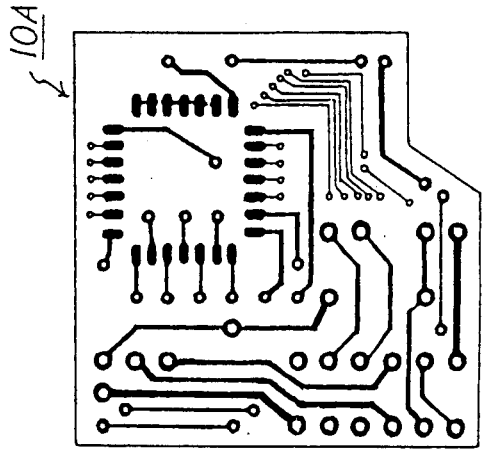
FIG. 6 illustrates in plan one of the printed circuit board portions formed by dividing the printed circuit board.

Since the multilayer printed circuit board 10 of FIG. 1 has a portion of the inner insulated layer 12 having no V-cut groove formed of only glass fiber nonwoven cloth, it can be manually broken so that it is divided at the inner insulated layer portion along the V-cut grooves 14a and 14'a into a plurality of printed circuit board portions 10A which can be mounted having a practical size. FIG. 5 illustrates the multilayer printed circuit board 10 with a portion thereof broken away and FIG. 6 illustrates one of the printed circuit board portions 10A formed by dividing the printed circuit board 10 along the V-cut grooves 14a. It should be noted that if the portion of insulated layer having no V-cut groove formed includes glass fiber woven cloth, then the multilayer printed circuit board 10 is not easily manually broken and also fins or thorns of glass fiber appear on the exposed end face of the board.

The outer insulated layers 14 and 14' of glass fiber woven cloth cause the multilayer printed circuit board 10 to have high physical strength.

It should be noted that the thickness t of the inner insulated layer portion of only glass fiber nonwoven cloth having no V-cut groove formed or remaining uncut should be so set as to be equal to at least one-fourth of the entire thickness T of the multilayer printed circuit board 10. If the thickness t of the insulated layer portion of only glass fiber nonwoven cloth having no V-cut groove formed is less than one-fourth of the whole thickness T of the printed circuit board 10, then it will disadvantageously have physical strength too low to treat the printed circuit board 10 without any damage. For example, when electronic devices such as semiconductor devices are to be mounted on the printed circuit board 10 in which the thickness t of the insulated layer portion of only glass fiber nonwoven cloth having no V-cut groove formed is less than one-fourth of the whole thickness T of the printed circuit board 10, it will be broken by vibration.

Figure 2:
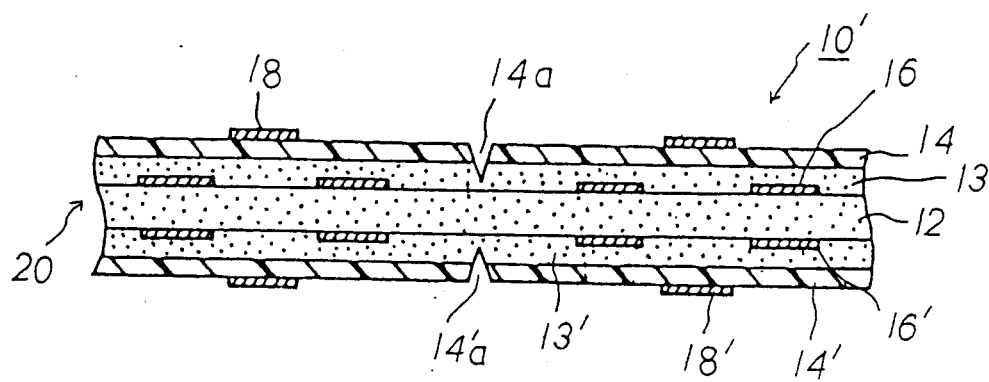
FIG. 2 is a cross sectional view of a multilayer printed circuit board constructed in accordance with another embodiment of the invention.

FIG. 2 illustrates a multilayer printed circuit board 10' constructed in accordance with another embodiment of the invention. In this embodiment, two additional inner insulated layers 13 and 13' of only glass fiber nonwoven cloth impregnated with thermosetting resin are provided on both faces of the inner insulated layer 12 of glass fiber nonwoven cloth and the outer insulated layers 14 and 14' are provided on outer faces of the additional insulated layers 13 and 13' of glass fiber nonwoven cloth. The inner circuit layers 16 and 16' are disposed between the inner insulated layer 12 and the additional inner insulated layers 13 and 13'. The multilayer printed circuit board 10' of FIG. 2 can be produced by the combined processes of FIGS. 3 and 4.

Figure 7A:
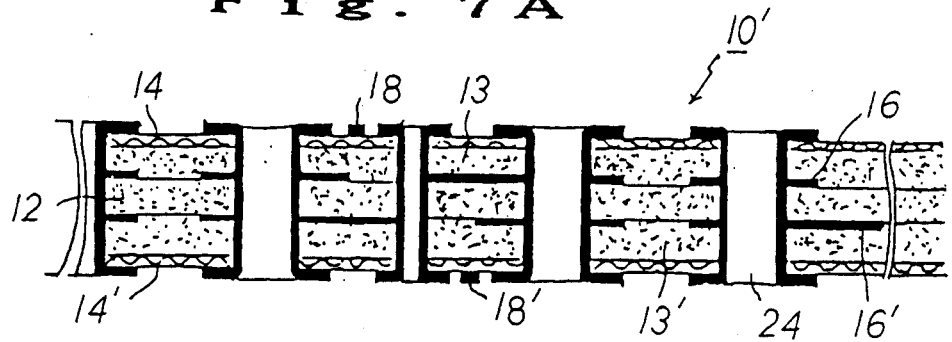
FIGS. 7A through 7D illustrate in cross section the steps of sequentially working and dividing the multilayer printed circuit board of FIG. 2.
Figure 7B:
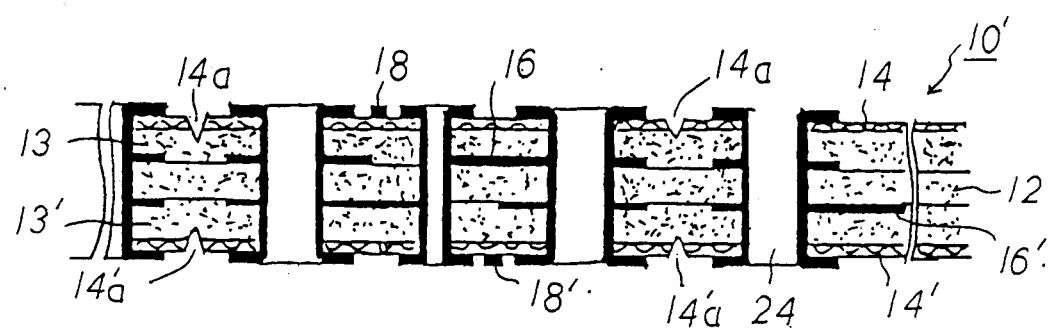
Figure 7C:
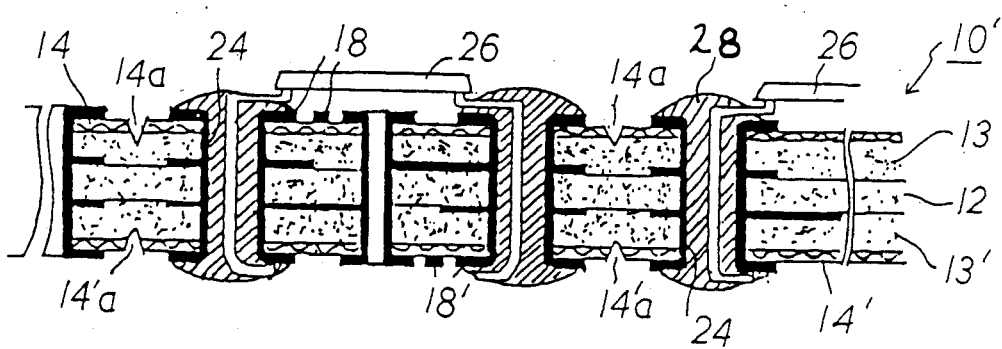
Figure 7D:
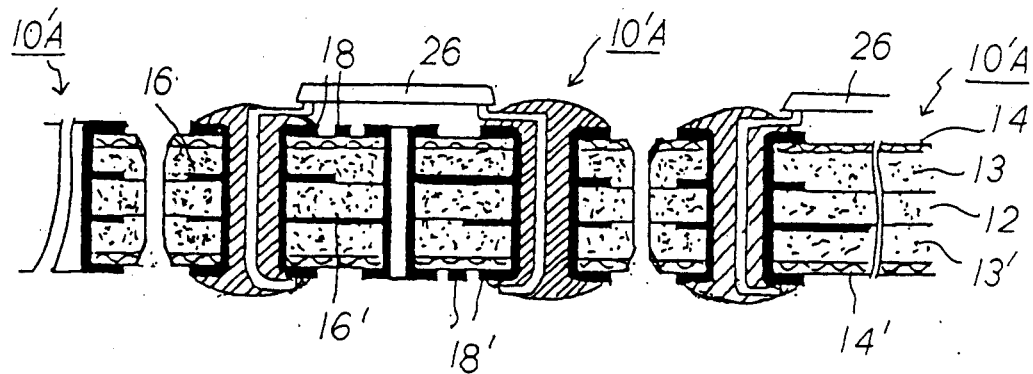

FIGS. 7A through 7D illustrate how the multilayer printed circuit board 10' of FIG. 2 are sequentially processed and divided. As shown in FIG. 7A, after the inner and outer insulated layers 12, 13, 13', 14 and 14' and the inner and outer circuit layers 16, 16', 18 and 18' are integrally provided, through-holes 24 are provided by any conventional means so that the circuit is formed by connecting the inner and outer circuit layers 16, 16', 18 and 18' to each other. Thereafter, as shown in FIG. 7B, V-cut grooves 14a and 14'a are formed so that the boundary lines of the board portions or pieces are marked. Further, electronic device or devices 26 are mounted on the multilayer printed circuit board 10' by soldering as shown in FIG. 7C. In this figure, numerals 28 designate solder filled in the through-holes 24 so as to connect leads of the electronic devices 26 to the printed circuit on the board 10'. After the circuits on the respective board portions or pieces 10A are finished, the board 10' is broken by hands of an operator to divide the printed circuit board 10' into a plurality of board portions or pieces 10' A as shown in FIG. 7D.

Some examples of the invention will be described hereinjustbelow.

EXAMPLE 1

53 g/m² of glass fiber nonwoven cloths were impregnated with bisphenol type epoxy resin and dried to prepare glass fiber nonwoven cloth prepregs having 85 weight % of resin included. Separately, 107 g/m² of glass fiber woven cloths were impregnated with bisphenol type epoxy resin and dried to prepare glass fiber woven cloth prepregs having 50 weight % of resin included.

Copper foils of 70 μm thickness were placed on both faces of two plies of glass fiber nonwoven cloth prepregs and thermally moulded under pressure to produce a laminate on both faces covered with copper foils. The copper foils were etched to form electrically conducting inner circuits on the laminate. The electrically conducting circutis were treated so that the surfaces of the circuits were black-colored. Thus, the inner circuit board portion was formed.

Two plies of glass fiber woven cloth prepregs were placed on both faces of the inner circuit board, respectively, and copper foils of 35 μm thickness were placed on the outer faces of the glass fiber woven cloth prepregs. They were thermally moulded under pressure by a conventional press to form copper foil covered laminate of 1.6 mm thickness having the inner circuits.

The copper foil covered laminate having the inner circuits was drilled and electrically plated with a predetermined pattern to form through-holes which were to connect the inner circuits to the outer circuits which were to be formed by the process described hereinjustbelow.

Thereafter, the copper foils on the laminate were etched by any conventional means with a predetermined pattern to produce a four-layer printed circuit board of 1.6 mm thickness.

The thus produced printed circuit board had a working size that included a plurality of board portions or pieces. After a plurality of V-cut grooves having depth equal to each other were formed in both faces of the printed circuit board, electronic devices such as IC's were mounted thereon. The V-cut grooves reached the central layer of only glass fiber nonwoven cloth and the thickness of the portion of the central layer having no V-cut groove formed was 0.8 mm.

EXAMPLE 2

The printed circuit board was substantially identical to that of Example 1, except that the thickness of the central layer portion having no V-cut groove formed was 0.4 mm.

EXAMPLE 3

Three plies of glass fiber woven cloth prepregs were placed on both faces of the inner circuit board portion obtained in Example 1, respectively, and copper foils of 35 μm thickness were placed on the outer faces of the glass fiber woven cloth prepregs. They were thermally moulded under pressure by a conventional press to form a copper foil covered laminate of 2.0 mm thickness having the inner circuits.

Thereafter, the through-holes and the outer circuits were formed in the same manner as described in Example 1 to produce the four-layer printed circuit board of 2.0 mm thickness.

The thus produced printed circuit board had a working size that included a plurality of board portions or pieces in the same manner as described in Example 1. After a plurality of V-cut grooves having depth equal to each other were formed in both faces of the printed circuit board, electronic devices such as IC's were mounted thereon. The V-cut grooves reached the central layer of only glass fiber nonwoven cloth and the thickness of the portion of the central layer having no V-cut groove formed was 0.8 mm.

EXAMPLE 4

The printed circuit board was substantially identical to that of Example 3, except that the thickness of the central layer portion having no V-cut groove formed was 0.4 mm.

COMPARISON 1

The printed circuit board was substantially identical to that of Example 1, except that the thickness of the central layer portion having no V-cut groove formed was 1.2 mm. Thus, it will be noted in Comparison 1 that the uncut portion of the laminate includes the glass fiber woven cloth layer portions because the glass fiber nonwoven cloth layer has the thickness of only 0.8 mm.

COMPARISON 2

The printed circuit board was substantially identical to that of Example 1, except that the thickness of the central layer portion having no V-cut groove formed was 0.3 mm.

COMPARISON 3

The printed circuit board was substantially identical to that of Example 1, except that the thickness of the central layer portion having no V-cut groove formed was 0.2 mm.

COMPARISON 4

53 g/m² of glass fiber nonwoven cloths were impregnated with bisphenol type epoxy resin and dried to prepare glass fiber nonwoven cloth prepregs having 78 weight % of resin included in the same manner as described in Example 1. Separately, 210 g/m² of glass fiber woven cloths were impregnated with bisphenol type epoxy resin and dried to prepare glass fiber woven cloth prepregs having 45 weight % of resin included.

A ply of glass fiber nonwoven cloth prepreg was held between two glass fiber woven cloth prepregs and copper foils of 70 μm thickness were placed on both faces of the glass fiber nonwoven cloth prepreg and the outer faces of the glass fiber woven cloth prepregs. The thus superposed prepregs were thermally moulded under pressure by a conventional press to produce a laminate of 0.8 mm thickness on both faces covered with copper foils.

The copper foils were etched to form electrically conducting inner circuits on the laminate. The electrically conducting circuits were treated so that the surfaces of the circuits were black-colored. Thus, the inner circuit board portion was formed.

Two plies of glass fiber woven cloth prepregs identical to those used in Example 1 were placed on both faces of the inner circuit board portion, respectively, and copper foils of 35 μm thickness were placed on the outer faces of the glass fiber woven cloth prepregs. They were thermally moulded under pressure by a conventional press to form copper foil covered laminate of 1.6 mm thickness having the inner circuits.

Thereafter, the through-holes and the outer circuits were formed in the same manner as described in Example 1 to produce the four-layer printed circuit board of 1.6 mm thickness.

The thus produced printed circuit board had a working size that included a plurality of board portions or pieces in the same manner as described in Example 1. After a plurality of V-cut grooves having depth equal to each other were formed in both faces of the printed circuit board, electronic devices such as IC's were mounted thereon. The central layer portion having no V-cut groove formed had a thickness of 0.8 mm, but it included glass woven cloth.

COMPARISON 5

The printed circuit board was substantially identical to that of Example 3, except that the thickness of the central layer portion having no V-cut groove formed was 1.6 mm. Thus, it will be noted in Comparison 5 that the uncut portion of the laminate includes the glass fiber woven cloth layer portions.

COMPARISON 6

The printed circuit board was substantially identical to that of Example 3, except that the thickness of the central layer portion having no V-cut groove formed was 0.4 mm.

The following table indicates various characteristics of the products of Examples 1 through 4 and Comparisons 1 through 6 when they are manually broken along the V-cut grooves. In the table, there are indicated three characteristics of appearance after division of the printed circuit board, ease with which they were divided and effectiveness in operation of mounting electronic devices after the V-cut grooves were formed. The printed circuit boards used in this test had a working size of 340 mm × 500 mm.

TABLE

| | Appearance Characteristics | Easiness of Division | Effectiveness in Operation |
| --- | --- | --- | --- |
| EXAMPLE 1 | no thorns of fiber | good | good |
| EXAMPLE 2 | no thorns of fiber | good | good |
| EXAMPLE 3 | no thorns of fiber | good | good |
| EXAMPLE 4 | no thorns of fiber | good | good |
| COMPARISON 1 | thorns of fiber appear | difficult to be broken | good |
| COMPARISON 2 | no thorns of fiber | easy to be broken | some boards broken (ratio = 10/100) |
| COMPARISON 3 | no thorns of fiber | easy to be broken | some boards broken (ratio = 14/100) |
| COMPARISON 4 | many thorns of fiber appear | difficult to be broken | good |
| COMPARISON 5 | many thorns of fiber appear | difficult to be broken | good |
| COMPARISON 6 | no thorns of fiber | easy to be broken | some boards broken (ratio = 33/100) |

Although some embodiments of the invention have been illustrated and described with reference to the accompanying drawings, it will be understood by those skilled in the art that they are by way of examples, and that various changes and modifications may be made without departing from the spirit and scope of the invention, which is intended to be defined only by the appended claims.

What is claimed is:

1. A multilayer printed circuit board comprising:
    a laminate of at least one insulated layer of only glass fiber nonwoven cloth impregnated with thermosetting resin and insulated layers of glass fiber woven cloth impregnated with thermosetting resin;
    said laminate having cutting grooves formed therein so that only glass fiber nonwoven cloth layer remains uncut whereby the multilayer printed circuit board can be divided at said uncut glass fiber nonwoven cloth layer along said cutting grooves into a plurality of printed circuit board portions which can be mounted having a practical size; and
    the thickness of said uncut glass fiber nonwoven layer being so set as to be equal to at least one-fourth of the entire thickness of the multilayer printed circuit board.

2. A multilayer printed circuit board as set forth in claim 1, and wherein one insulated layer of only glass fiber nonwoven cloth remaining uncut is provided.

3. A multilayer printed circuit board as set forth in claim 1, and wherein a plurality of insulated layers of only glass fiber nonwoven cloth remaining uncut are provided with inner circuit layers provided between adjacent insulated layers of only glass fiber nonwoven cloth.

4. A multilayer printed circuit board as set forth in claim 1, and wherein said cutting grooves are in the form of V shape in cross section.

5. A process of producing multilayer printed circuit boards comprising the steps of:
    thermally molding at least one first insulated layer of resin impregnated glass fiber nonwoven cloth with circuit layers provided on both sides thereof and a second insulated layer of resin impregnated glass fiber woven cloth to form a laminate;
    forming through-holes in said laminate so that a circuit is formed by connecting said circuit layers;
    forming grooves in said laminate to partition said laminate into a plurality of multilayer printed circuit boards so that only glass fiber nonwoven cloth remains uncut and so that the thickness of said at least one uncut glass fiber nonwoven cloth layer is so set as to be equal to at least one-fourth of the entire thickness of said laminate;
    mounting electronic devices on said multilayer printed circuit boards and connecting them to each other through said circuit layers; and
    breaking said laminate along said grooves so that the plurality of multilayer printed circuit boards are separated.

6. The process as set forth in claim 5, including preparing the laminate to also include a third insulated layer of glass fiber woven cloth with said nonwoven cloth layer in between.

* * * * *